United States Patent
Lee et al.

(10) Patent No.: US 11,515,578 B2
(45) Date of Patent: Nov. 29, 2022

(54) APPARATUS AND APPLICATION FOR PREDICTING PERFORMANCE OF BATTERY

(71) Applicant: LG CHEM, LTD., Seoul (KR)

(72) Inventors: Hu Jun Lee, Daejeon (KR); Ho Byung Yoon, Daejeon (KR); Yean Sik Choi, Daejeon (KR)

(73) Assignee: LG ENERGY SOLUTION, LTD., Seoul (KR)

( * ) Notice: Subject to any disclaimer, the term of this patent is extended or adjusted under 35 U.S.C. 154(b) by 220 days.

(21) Appl. No.: 16/993,084

(22) Filed: Aug. 13, 2020

(65) Prior Publication Data
US 2021/0184273 A1 Jun. 17, 2021

(30) Foreign Application Priority Data
Aug. 5, 2019 (KR) .......................... 10-2019-0095018

(51) Int. Cl.
 *H01M 10/42* (2006.01)
 *G01R 31/36* (2020.01)
 *G01R 31/367* (2019.01)

(52) U.S. Cl.
 CPC ...... *H01M 10/4285* (2013.01); *G01R 31/367* (2019.01); *G01R 31/3647* (2019.01); *H01M 10/425* (2013.01); *H01M 2010/4271* (2013.01); *H01M 2220/20* (2013.01)

(58) Field of Classification Search
None
See application file for complete search history.

(56) References Cited

U.S. PATENT DOCUMENTS

| | | | |
|---|---|---|---|
| 2015/0134186 A1 | 5/2015 | Yuasa et al. | |
| 2015/0301118 A1 | 10/2015 | Tao et al. | |
| 2016/0111908 A1* | 4/2016 | Kwark | H02J 7/007 324/426 |
| 2017/0123013 A1 | 5/2017 | Tao et al. | |
| 2018/0080990 A1 | 3/2018 | Seo | |
| 2018/0115178 A1* | 4/2018 | Moon | G01R 31/3835 |
| 2018/0170207 A1 | 6/2018 | Ko | |
| 2019/0006724 A1 | 1/2019 | Cho et al. | |

FOREIGN PATENT DOCUMENTS

| | | |
|---|---|---|
| JP | 5919760 B2 | 5/2016 |
| JP | 6237643 B2 | 11/2017 |
| JP | 6397730 B2 | 9/2018 |
| KR | 10-2014-0004519 A | 1/2014 |
| KR | 10-1502989 B1 | 3/2015 |
| KR | 10-2015-0050684 A | 5/2015 |
| KR | 10-2018-0018040 A | 2/2018 |
| KR | 10-2018-0031205 A | 3/2018 |
| KR | 10-2018-0071638 A | 6/2018 |

* cited by examiner

*Primary Examiner* — Roy Y Yi
(74) *Attorney, Agent, or Firm* — Birch, Stewart, Kolasch & Birch, LLP

(57) ABSTRACT

Discussed is an application that efficiently utilizes a vehicle battery by predicting performance of the vehicle battery and an available driving distance based on environmental condition of an area where a vehicle is parked and state information of the vehicle battery.

13 Claims, 6 Drawing Sheets

[FIG 1]
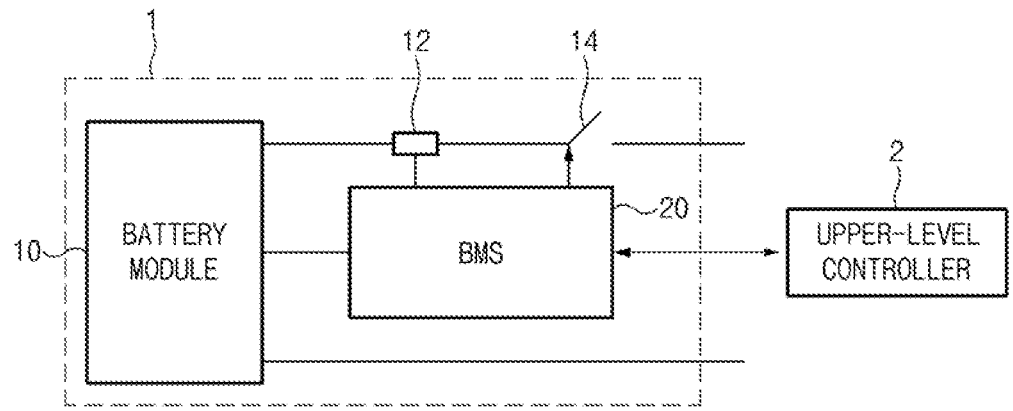
[FIG 2]
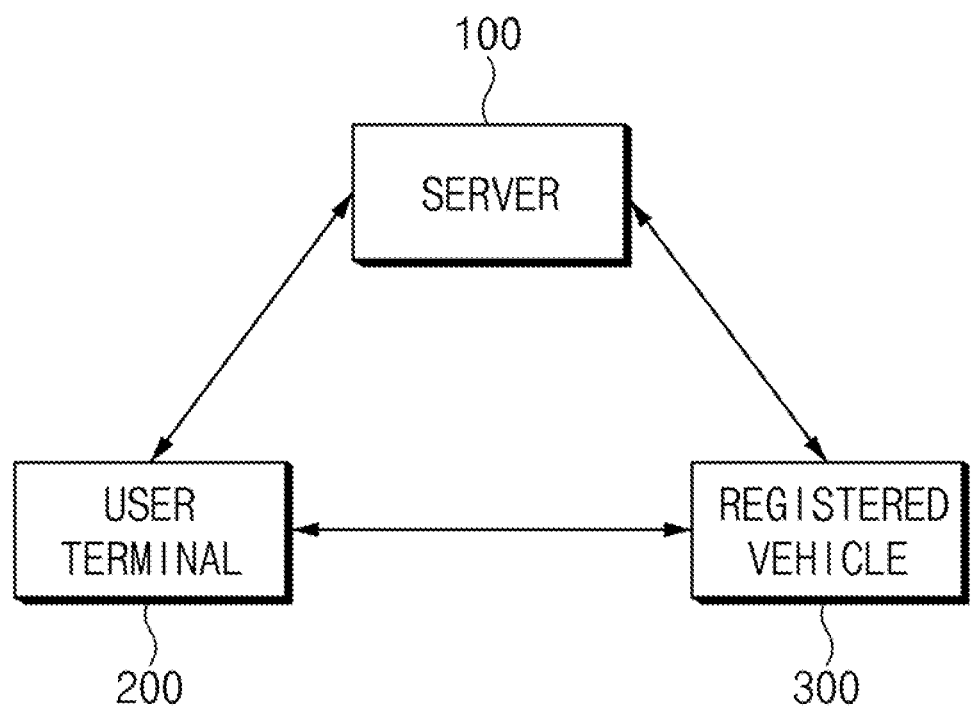

[FIG. 3]
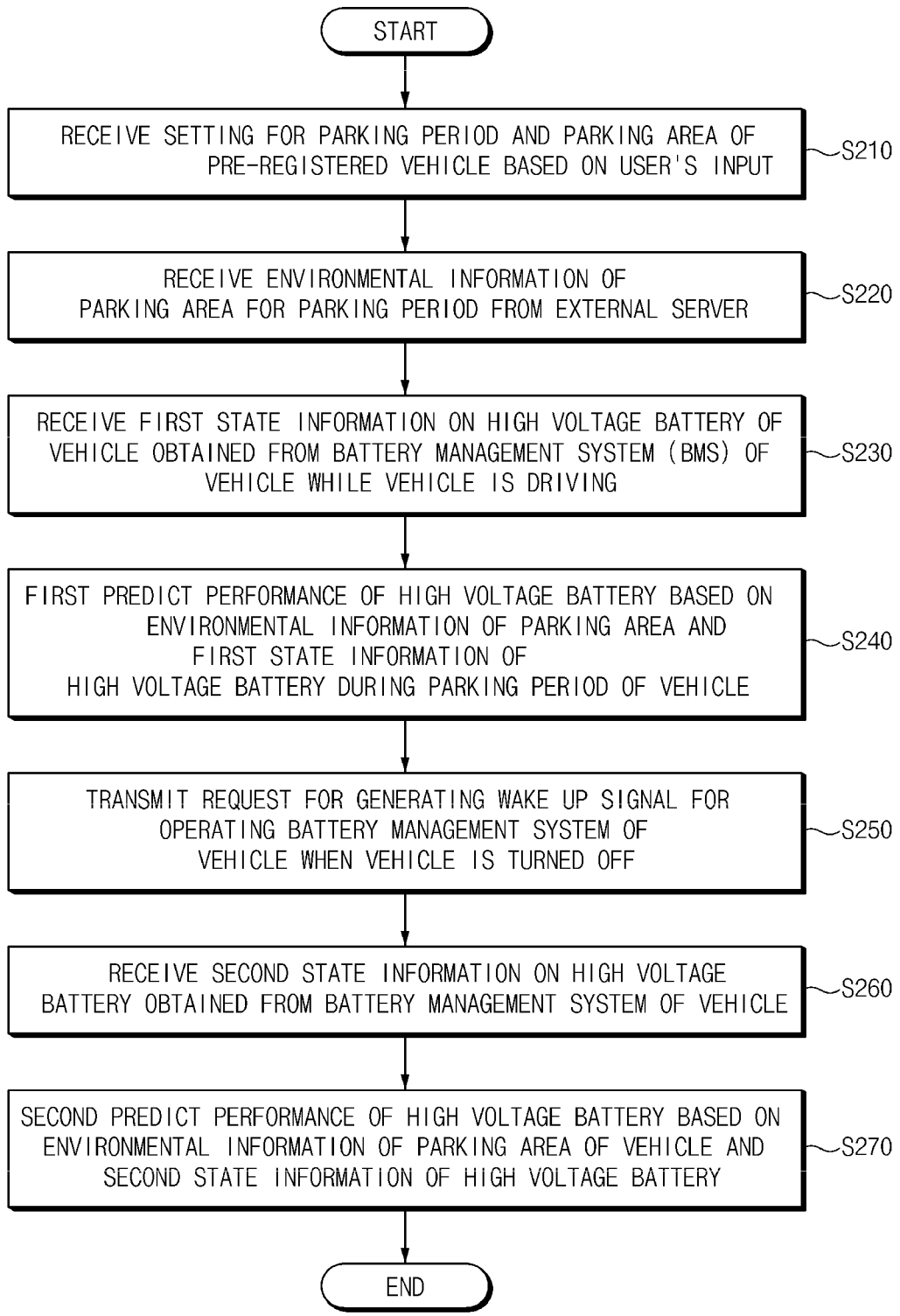

[FIG 4]
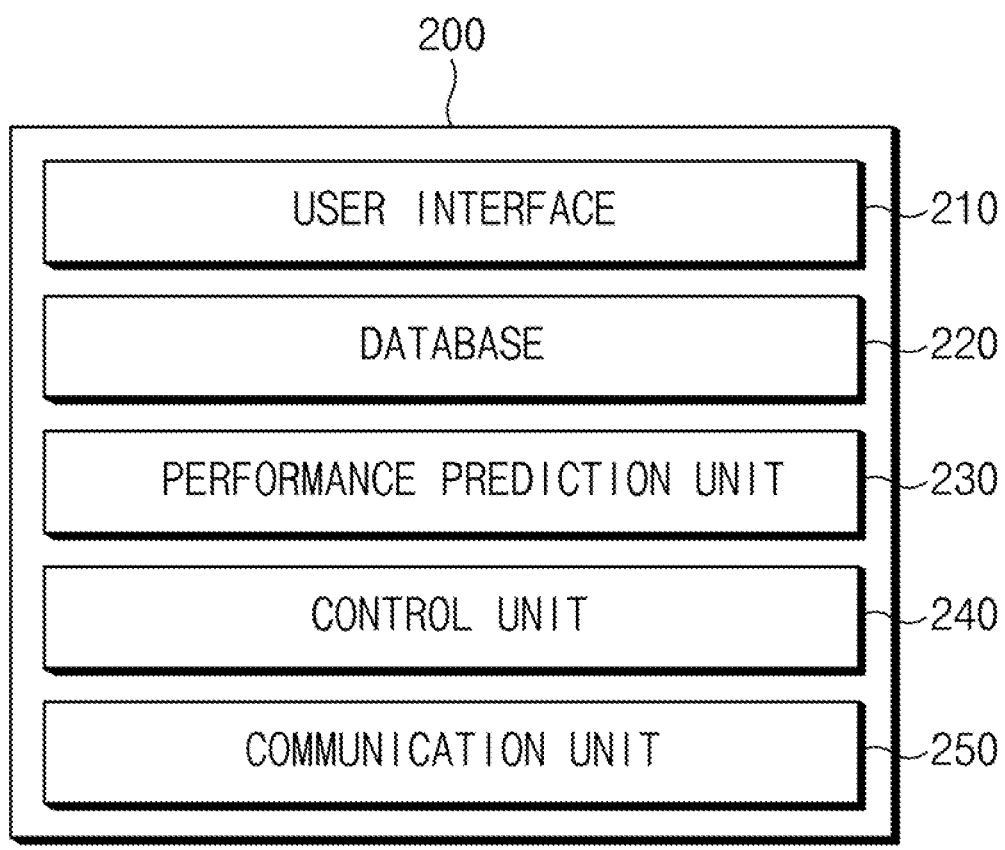

[FIG. 5]
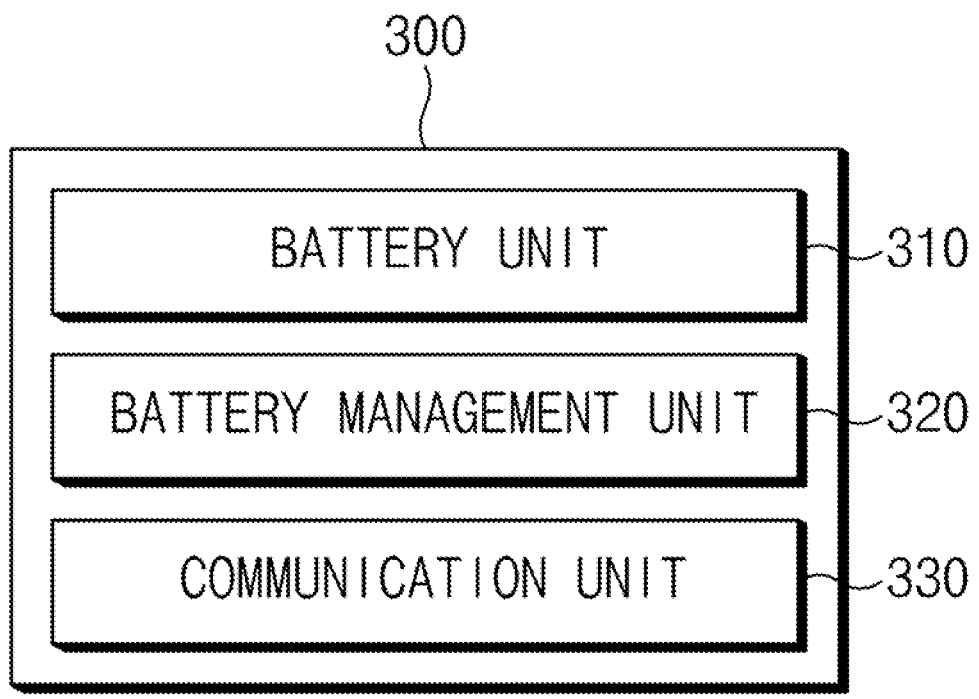

[FIG 6]
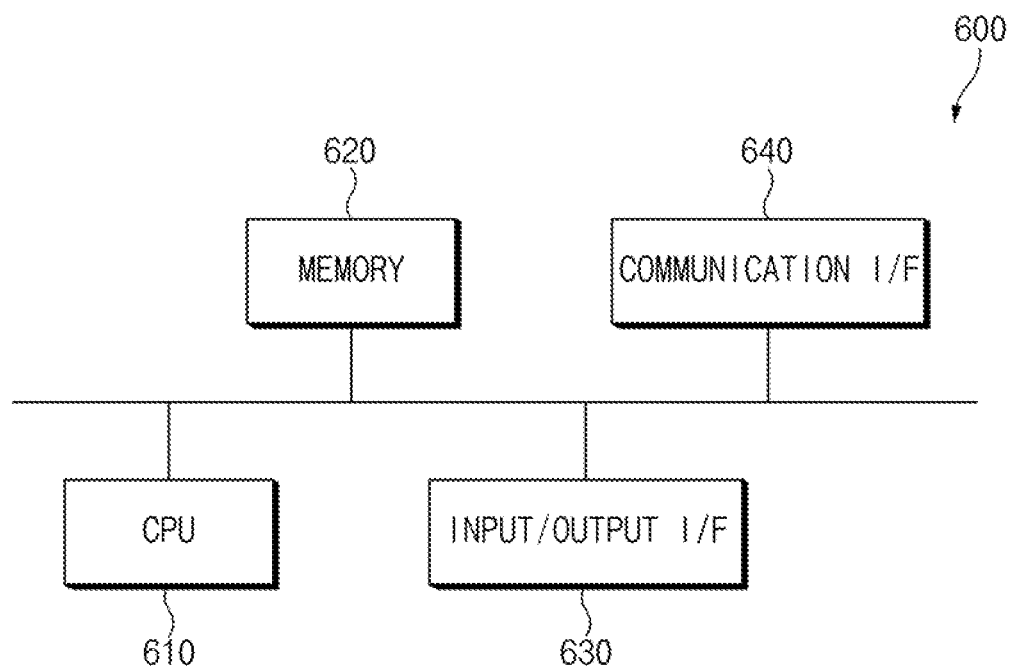

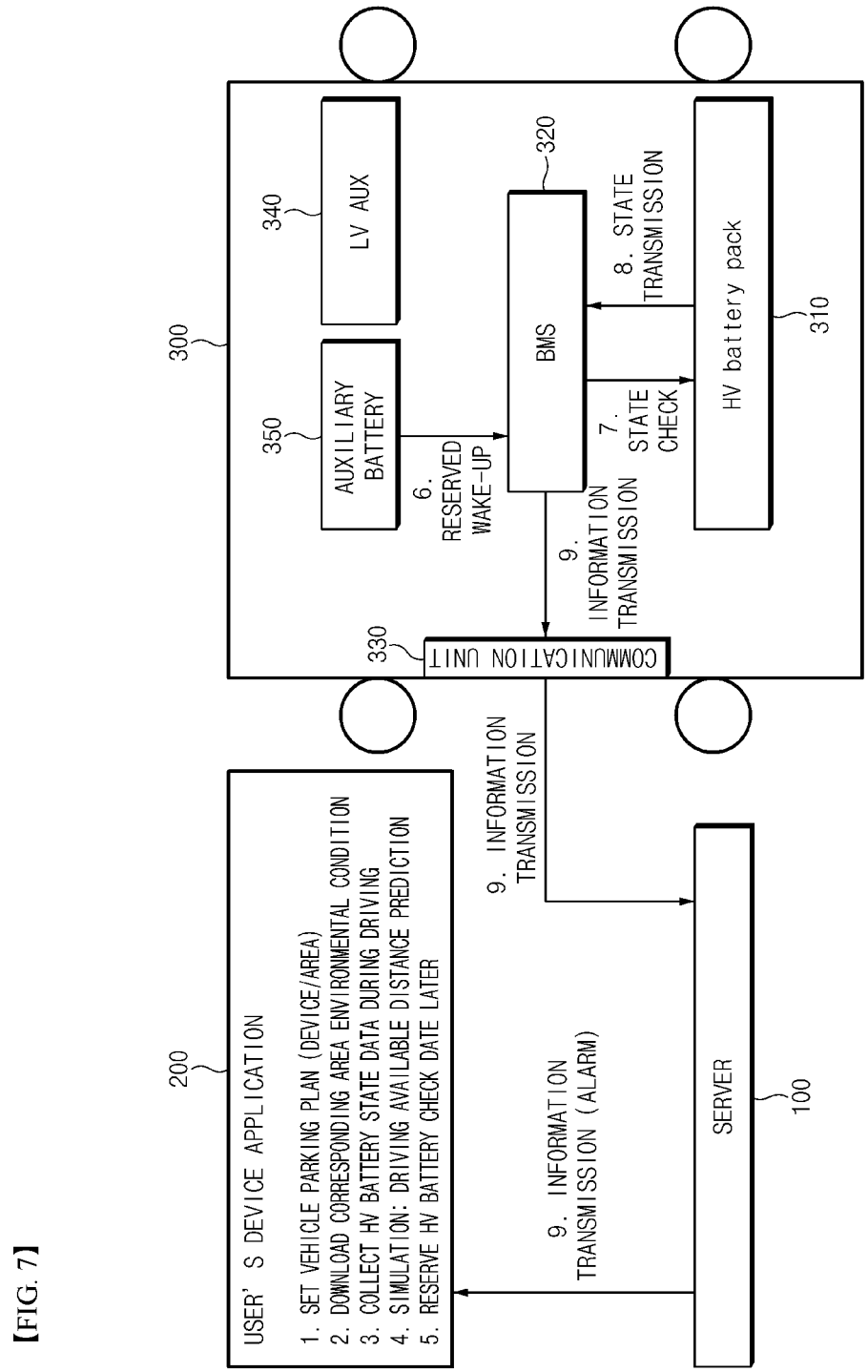
[FIG. 7]

APPARATUS AND APPLICATION FOR PREDICTING PERFORMANCE OF BATTERY

CROSS-REFERENCE TO RELATED APPLICATIONS

This application claims the benefit of Korean Patent Application No. 10-2019-0095018, filed on Aug. 5, 2019, in the Korean Intellectual Property Office, the disclosure of which is incorporated herein in its entirety by reference.

TECHNICAL FIELD

The present invention relates to an apparatus and application for predicting the performance of a vehicle battery.

BACKGROUND ART

In recent years, as the performance of electric vehicles develops, the importance of a driving available distance according to the capacity of a battery has also emerged. Since the performance or deterioration rate of a vehicle's battery differs depending on the usage environment, if this is properly analyzed and utilized, it is possible for efficient use.

Moreover, in the case of a vehicle parked for a long time, the performance for the capacity of a high voltage (HV) battery may change due to reasons such as constant current consumption, environmental conditions such of temperature and humidity, and the degree of battery deterioration, but conventionally, it was not possible to check and manage the capacity of a HV battery until the user directly started the electric vehicle and checked the driving distance.

As such, it is an important task to predict the capacity of a HV battery in a vehicle as a factor affecting the driving available distance in today's electric vehicles.

DISCLOSURE

Technical Problem

As designed to solve the above problems of the present invention, the purpose of this study is to provide a battery performance prediction apparatus and application that enable efficient use of the battery by predicting the performance of a vehicle battery and a driving available distance based on the environmental conditions of the area where a vehicle is parked and the state information of the battery.

Technical Solution

An application according to an embodiment of the present invention is an application stored in a computer-readable medium executed by a device executing an application that predicts battery performance, and includes receiving a setting for a parking period and a parking area of a pre-registered vehicle based on a user's input, receiving environment information of the parking area during the parking period from an external server, receiving first state information on a high voltage battery of the vehicle, which is obtained from a battery management system (BMS) when the vehicle is driving, predicting performance of the high voltage battery based on environment information of the parking area during the parking period and first state information of the high voltage battery, transmitting a request for generating a wake-up signal for operating the battery management system of the vehicle in a state in which the vehicle is turned off, receiving second state information on the high voltage battery, which is obtained from the battery management system of the vehicle, and updating the performance of the high voltage battery based on the environment information of the parking area and the second state information of the high voltage battery.

The application according to an embodiment of the present invention includes receiving a reservation request for performing a state test of the high voltage battery of the vehicle, wherein the transmitting of the request for generating the wake-up signal may be performed at a reservation time according to the reservation request.

The request for generating the wake-up signal of the application according to an embodiment of the present invention includes an instruction for generating a wake-up signal every preset time interval, wherein the updating of the performance of the high voltage battery may be performed at the preset time interval.

The performance of the high voltage battery of the application according to an embodiment of the present invention may include a driving available distance of the vehicle.

The environment information of the parking area of the application according to an embodiment of the present invention may include temperature and humidity of the parking area.

The first state information of the application according to an embodiment of the present invention may include state information of the high voltage battery up to a time point when the vehicle is turned off after the vehicle is parked.

The first state information of the application according to an embodiment of the present invention may include information on voltage, State of Charge (SOC), and State of Health (SOH) of the battery.

The application according to an embodiment of the present invention may further include simulating a state change trend of the high voltage battery in the environmental condition of the parking area.

The application according to an embodiment of the present invention may further include predicting the performance of the high voltage battery based on state information of a battery collected from another pre-registered vehicle parked in the parking area during the parking period.

A battery performance prediction apparatus for vehicle according to an embodiment of the present invention includes a high voltage battery configured to supply a high voltage to a vehicle, a battery management system configured to obtain first state information through a state test of the high voltage battery when the vehicle is driving, and obtain second state information through the state test of the high voltage battery when the battery management system is driven by a wake-up signal in a state in which the vehicle is turned off, and a communication unit configured to transmit the first state information and the second state information to the outside.

The battery management system of the battery performance prediction apparatus for vehicle according to an embodiment of the present invention is operated by a wake-up signal generated at a preset reservation time from a user.

The communication unit of the battery performance prediction apparatus for vehicle according to an embodiment of the present invention receives a reservation request from a user terminal.

The battery management system of the battery performance prediction apparatus for vehicle according to an embodiment of the present invention may predict performance of the high voltage battery based on at least one of the first state information and the second state information.

The battery management system of the battery performance prediction apparatus for vehicle according to an embodiment of the present invention may predict the performance of the high voltage battery at a preset time interval.

The performance of the high voltage battery of the battery performance prediction apparatus for vehicle according to an embodiment of the present invention may include a driving available distance of the vehicle.

Advantageous Effects

According to a performance prediction apparatus and application of the battery of the present invention, the battery can be efficiently utilized by predicting the performance of the vehicle battery and the driving available distance based on the environmental condition of the area where the vehicle is parked and the state information of the battery.

DESCRIPTION OF DRAWINGS

FIG. 1 is a block diagram showing the configuration of a general battery management system.

FIG. 2 is a diagram illustrating communication between a user terminal and a performance prediction apparatus of a battery of a registered vehicle according to an embodiment of the present invention.

FIG. 3 is a flowchart illustrating an operation of an application according to an embodiment of the present invention.

FIG. 4 is a block diagram showing a function of an application according to an embodiment of the present invention.

FIG. 5 is a block diagram illustrating a configuration of a performance prediction apparatus for a battery according to an embodiment of the present invention.

FIG. 6 is a diagram illustrating a hardware configuration of a performance prediction apparatus of a battery according to an embodiment of the present invention.

FIG. 7 is a diagram illustrating an operation of a server, an application, and a performance prediction apparatus of a battery of a vehicle according to an embodiment of the present invention.

BEST MODE

Hereinafter, various embodiments of the present invention will be described in detail with reference to the accompanying drawings. In this document, the same reference numerals are used for the same components in the drawings, and duplicate descriptions for the same components are omitted.

For various embodiments of the present invention disclosed in this document, specific structural or functional descriptions are exemplified only for the purpose of explaining an embodiment of the present invention, and various embodiments of the present invention may be implemented in various forms and should not be construed as being limited to the embodiments described in this document.

The terms such as "1st", "2nd", "first", "second", and the like used herein may refer to modifying various different elements of various embodiments of the present disclosure, but do not limit the elements. For example, a first component may be referred to as a second component and vice versa without departing from the technical scope of the present invention.

Terms used herein is for the purpose of describing particular example embodiments only and is not intended to be limiting of the scope of other embodiments. The terms of a singular form may include plural forms unless they have a clearly different meaning in the context.

Otherwise indicated herein, all the terms used herein, which include technical or scientific terms, may have the same meaning that is generally understood by a person skilled in the art. In general, the terms defined in the dictionary should be considered to have the same meaning as the contextual meaning of the related art, and, unless clearly defined herein, should not be understood as having an ideal or excessively formal meaning. In any cases, even the terms defined in this specification cannot be interpreted as excluding embodiments of the present invention.

FIG. 1 is a block diagram showing the configuration of a general battery management system.

Referring to FIG. 1, a configuration diagram schematically showing a battery control system including a battery pack 1 and an upper-level controller 2 included in an upper-level system according to an embodiment of the present invention is shown.

As shown in FIG. 1, the battery pack 1 includes a battery module 10 composed of one or more battery cells and capable of being charged and discharged, a switching unit 14 connected in series to the + terminal side or the − terminal side of the battery module 10 to control the charge/discharge current flow of the battery module 10, and a battery management system 20 that monitors the voltage, current, temperature, and the like of the battery module 10 to control and manage it so as to prevent overcharge and overdischarge. Here, although the battery management system 20 is described as being connected to the battery module, it may be connected for each battery cell to monitor and measure the voltage and current temperature of the battery cells. A battery cell management system (not shown) is disposed for each battery cell, and each of the plurality of battery cell management systems may transmit and receive data to and from the battery management system 20 that monitors and controls the battery module. The battery cell management system is similar in operation and function to the battery management system 20.

Here, the switching unit 14 is a semiconductor switching element for controlling the current flow for the charge or discharge of the battery module 10, and for example, at least one MOSFET may be used.

In addition, in order to monitor the voltage, current, temperature, etc. of the battery pack module 10, the BMS 20 can measure or calculate voltages and currents of gates, sources, and drains of semiconductor switching elements, and in addition, can measure the current, voltage, temperature, etc. of the battery module using the sensor 12 provided adjacent to the semiconductor switching element 14. The BMS 20 is an interface for receiving the values obtained by measuring the above-described various parameters, and may include a plurality of terminals and a circuit that is connected to these terminals and processes the received values.

In addition, the BMS 20 may control ON/OFF of the switching element 14 such as the MOSFET and may be connected to the battery module 10 to monitor the state of the battery module 10.

The upper-level controller 2 may transmit a control signal for the battery module to the BMS 20. Accordingly, operations of the BMS 20 may be controlled based on a signal applied from an upper-level controller. The battery cell of the present invention may be a component included in a battery pack used for an ESS or a vehicle. However, it is not limited to this use.

Since the configuration of the battery rack 1 and the configuration of the BMS 20 are known configurations, more detailed description thereof will be omitted.

Meanwhile, the performance prediction apparatus according to embodiments of the present invention may be connected to each of a plurality of battery cells connected in series in the battery module 10 to perform performance prediction of the battery cell. However, the present invention is not limited thereto, and the performance prediction apparatus according to embodiments of the present invention may be connected to a battery module or a battery pack to perform performance prediction.

FIG. 2 is a diagram illustrating communication between a user terminal and a performance prediction apparatus of a battery of a registered vehicle according to an embodiment of the present invention.

Referring to FIG. 2, a server 100, a user terminal (application) 200, and a registered vehicle (vehicle, pre-registered vehicle, or performance prediction apparatus) 300 may be connected through a network.

The server 100 may be an external server including a separate database and a communication module, and may transmit and receive various data to and from the user terminal 200 and the vehicle 300. For example, the server 100 may store information on environmental conditions (e.g., weather, temperature, humidity, etc.) of an area in which the registered vehicle 300 is parked. In addition, the server 100 may receive battery state information of the registered vehicle 300, data related to battery performance, and the like from the user terminal 200 and the registered vehicle 300. The received data may be stored in a database provided in the server.

As will be described later, the application stored in the user terminal 200 may download information on environmental conditions of a corresponding area from the server 100 when the user sets a parking plan for the vehicle. In addition, the application of the user terminal 200 may predict battery performance based on environmental information and battery state information, and transmit the result information to the server 100.

In addition, the user terminal 200 may transmit a reservation signal for waking up the battery management system to the registered vehicle 300, and receive data on the state and performance (e.g., driving available distance or available driving distance) of the battery from the registered vehicle 300.

The registered vehicle 300 may be a vehicle previously registered by a user of the vehicle through an application or a web page according to an embodiment of the present invention. For example, when receiving a reservation signal from the user terminal 200, the vehicle 300 may predict the state and performance of the internal battery using the battery management system, and transmit the result information to the server 100 or the user terminal 200.

Specific operations of the server 100, the user terminal 200, and the vehicle 300 of FIG. 2 will be described below.

FIG. 3 is a flowchart illustrating an operation of an application according to an embodiment of the present invention.

Referring to FIG. 3, an application according to an embodiment of the present invention may be executed by a device executing an application that predicts performance of a vehicle battery.

First, the application may receive a setting for a parking period and a parking area of a pre-registered vehicle based on a user's input (S210). In this case, the user can directly set the parking period and parking area to be parked through an interface provided on the device. In addition, the set parking period and parking area can be arbitrarily changed if the user desires.

In addition, the application may receive a reservation time setting for the state test of the battery by the user. Therefore, the user can perform the battery state test of the vehicle at a desired time through the application.

Then, the application may receive environmental information of the parking area during the set parking period from the external server (S220). For example, the environmental information of the parking area may include temperature and humidity of the parking area during the parking period. In general, since the high voltage battery of a vehicle is greatly affected by the surrounding environment, in order to predict the performance of the high voltage battery, it is necessary to obtain environmental information of the area where the vehicle is parked in advance.

Then, the application may receive environmental information of the parking area during the set parking period from the external server (S220). For example, the environmental information of the parking area may include temperature and humidity of the parking area during the parking period. In general, since the battery of a vehicle is highly influenced by the surrounding environment, it is necessary to obtain environmental information of an area where the vehicle is parked in advance in order to predict the performance of the battery.

Next, when the vehicle is driven, first state information on the high voltage battery of the vehicle obtained from the vehicle battery management system BMS may be received (S230). In this case, the first state information may be state information of the high voltage battery up to a time point when the vehicle is turned off after the vehicle is parked. In addition, the first state information may include information on a voltage, a state of charge (SOC), and a state of health (SOH) of a battery. In such a way, through the application of FIG. 3, data on the voltage and the degree of deterioration of the battery during driving of the vehicle may be logged.

As described above, the user's device may be wirelessly connected to the vehicle through a network, and the device may directly receive state information of the battery measured by the battery management system BMS inside the vehicle. For example, the battery of the vehicle is not limited to a high voltage battery, and may include an auxiliary battery, a low voltage (LV) battery, and the like.

In addition, the performance of the high voltage battery may be predicted based on the environment information of the parking area during the parking period and the first state information of the high voltage battery (S240) (first prediction). For example, the performance of the high voltage battery may include a driving available distance of the vehicle. In this case, a state change trend of the high voltage battery may be simulated based on the environment information of the parking area and the battery state information. For example, the state change trend of the battery can be visualized in the form of a graph on the application of the user device.

In operation S250, a request for generating a wake-up signal for operating the battery management system of the vehicle in a state in which the vehicle is turned off may be transmitted. In addition, the user terminal may receive second state information on the high voltage battery obtained from the vehicle battery management system (S260).

Next, the predicted performance of the high voltage battery may be updated based on the environment information of the parking area and the second state information of the high voltage battery (S270) (second prediction). Through this, the state of the high-voltage battery and the driving available distance are notified to the user and can be used for vehicle operation.

Meanwhile, although not shown in FIG. 3, the application according to an embodiment of the present invention may perform an operation of receiving a reservation request for performing a state test of a high voltage battery of a vehicle. In this case, the request for generating a wake-up signal performed at the reservation time may include an instruction for generating the wake-up signal every preset time interval. Accordingly, operation S270 of updating the performance of the high voltage battery may be performed at a preset time interval.

In addition, the application according to an embodiment of the present invention may include predicting the performance of the high voltage battery based on state information of the battery collected from other previously registered vehicles parked in the parking area during the parking period. Therefore, it is possible to more accurately predict the performance of the battery by further considering the state information of the battery of another pre-registered vehicle.

In such a way, according to the application of the present invention, the battery can be efficiently utilized by predicting the performance of the vehicle battery and the driving available distance based on the environmental condition of the area where the vehicle is parked and the state information of the battery.

FIG. 4 is a block diagram showing a function of an application according to an embodiment of the present invention.

Referring to FIG. 4, the user terminal 200 may include an application according to an embodiment of the present invention, and may include a user interface 210, a database 220, a performance prediction unit 230, a control unit 240, and a communication unit 250. The application may be embodied as the user terminal 200.

The user interface 210 allows a user (e.g., a vehicle driver) to set or select various functions of the application according to an embodiment of the present invention. For example, the user interface 210 may be provided as a separate menu on the application, and may be provided in the form of a keyboard or a touch pad so that the user can directly input it.

For example, the user can directly set the parking area and the parking period of the vehicle through the user interface 210, and can directly download environmental information of the parking area during the parking period from the server.

The database 220 may store data inputted through the user interface 210 or received from an external server or vehicle. For example, the database 220 may store information on the parking area and parking period inputted through the user interface 210, identification information of the registered vehicle, environmental information of the parking area during the parking period received from the server, state information of the battery received from the vehicle, information on performance prediction, and the like.

The performance prediction unit 230 may predict the performance of a battery (e.g., a high voltage battery) by analyzing environmental information of a parking area received from a server and state information of a battery received from a registered vehicle. In addition, the performance prediction unit 230 may further predict battery performance by analyzing battery state information of another vehicle collected from the server.

The control unit 240 functions to control various components of the application according to an embodiment of the present invention.

The communication unit 250 may receive data (e.g., environmental information such as weather, temperature, humidity data, etc. of a parking area) from an external server, and receive state information of a battery from a registered vehicle. In addition, the communication unit 250 may transmit information on the predicted performance (e.g., driving available distance) through the application to the server, and transmit a reservation request signal to the vehicle to wake up the vehicle's battery management system. The function of the communication unit 250 may be implemented by a communication module included in a user terminal executing an application.

FIG. 5 is a block diagram illustrating a configuration of a performance prediction apparatus for a battery according to an embodiment of the present invention.

Referring to FIG. 5, the performance prediction apparatus 300 of a battery according to an embodiment of the present invention may include a battery unit 310, a battery management unit 320, and a communication unit 330.

The battery unit 310 may supply voltage to the vehicle. For example, the battery unit 310 may be a high voltage (HV) battery pack or a high voltage battery. However, the present invention is not limited thereto, and the battery unit 310 may include a low voltage (LV) battery, a low voltage auxiliary battery (LV Aux), an auxiliary battery, or the like. The voltage of the high voltage battery may be greater than the voltage of the low voltage battery.

The battery management unit 320 may obtain first state information through a state test of a high voltage battery when the vehicle is driving, and obtain second state information through a state test of the high voltage battery when the battery management system is driven by a wake-up signal in a state in which the vehicle is turned off. For example, the battery management unit 320 may be operated by a wake-up signal generated at a preset reservation time. In this case, the wake-up signal may be received from the auxiliary battery of the vehicle.

In addition, the battery management unit 320 may predict the performance of the battery unit 310 based on the first state information and the second state information of the battery unit 310. For example, the performance of the battery unit 310 may include a driving available distance of the vehicle. In this case, the battery unit 310 may collect logging information such as voltage, SOC, and SOH of the battery unit 310 even in a state in which the vehicle is turned off, and may predict the time-specific performance of the battery unit 310. For example, the performance predicted by time may be expressed as "Able to drive 89 km after 15 days", "Able to drive 42 km after 30 days", and the like.

In addition, the battery management unit 320 may predict the performance of the battery unit 310 based on state information of a battery of another pre-registered vehicle, which is received through the communication unit 330. That is, the battery management unit 320 may more accurately predict the performance by reflecting the battery state information of another vehicle to the performance previously predicted through the battery state test.

The communication unit 330 may receive a reservation request signal from an application executed by a user's device. In addition, the communication unit 330 may transmit the first state information and the second state information of the battery unit 310 to the outside. In this case, the communication unit 330 may transmit the result of the state test of the battery unit 310 to a user terminal or an external server.

In addition, the communication unit 330 may receive state information of a battery for another pre-registered vehicle parked in a parking area of the vehicle. In this case, the communication unit 330 may receive state information of the battery from another pre-registered vehicle from the server.

On the other hand, although not shown in FIG. 5, the performance prediction apparatus 300 according to an embodiment of the present invention may further include a timer (not shown), and may measure the reservation time indicated by the reservation request signal received from the application with a timer. Accordingly, the battery management unit 320 may determine the reservation time by the timer and transmit a wake-up signal transmission request to the auxiliary battery.

In this way, according to the performance prediction apparatus of the battery of the present invention, the battery can be efficiently utilized by predicting the performance of the vehicle battery and the driving available distance based on the environmental condition of the area where the vehicle is parked and the state information of the battery.

FIG. 6 is a diagram illustrating a hardware configuration of a performance prediction apparatus of a battery according to an embodiment of the present invention.

As shown in FIG. 6, the performance prediction apparatus 600 of the battery may include a microcontroller (MCU) 610 that controls various processes and configurations, a memory 620 in which an operating system program and various programs (e.g., a battery pack abnormality diagnosis program or battery pack temperature estimation program to check the state of the battery) are recorded, an input/output interface 630 that provides an input interface and an output interface between a battery cell module and/or a switching unit (e.g., a semiconductor switching element), and a communication interface 640 capable of communicating with an external (for example, upper-level controller) through a wired or wireless communication network. As described above, the computer program according to the present invention may be recorded in the memory 620 and processed by the microcontroller 610 to be implemented as a module for performing the respective functional blocks shown in FIG. 3.

FIG. 7 is a diagram illustrating an operation of a server, an application, and a performance prediction apparatus of a battery of a vehicle according to an embodiment of the present invention.

Referring to FIG. 7, a server 100, a user terminal 200 and a registered vehicle (performance prediction apparatus) 300 are included. In addition, the vehicle 300 may include a high voltage (HV) battery 310, a battery management system (BMS) 320, a communication unit 330, a low voltage (LV) battery 340, and an auxiliary battery 350.

First, the application of the user terminal 200 receives a setting for the parking plan (i.e., parking area and parking period) of the vehicle from the user. In addition, environmental information (e.g., temperature, humidity, etc.) that may affect the state of the battery for the set parking area and period is received from the server 100 of FIG. 7 or a separate external server.

When a user carrying the user terminal 200 drives the vehicle 300, the user terminal 200 is wirelessly connected to the vehicle 300 to receive state information of the battery of the vehicle 300 (e.g., the high voltage battery 310). Accordingly, the user can log data related to the voltage, SOC, and SOH of the high voltage battery 310 until the vehicle 300 is turned off.

When the user terminal 200 receives state information of the high voltage battery 310 from the vehicle 300, the application analyzes the state change of the high voltage battery 310 in the corresponding condition based on the environmental information and the state information of the high voltage battery 310 to predict the performance (e.g., driving available distance) of the high voltage battery 310. In addition, the application may predict the performance of the high voltage battery 310 using battery state change information collected from another registered vehicle, which is stored in the server 100. At this time, the application can simulate the state change trend of the high voltage battery 310.

Through the application of the user terminal 200, the user may check the prediction result on the performance of the high voltage battery 310 and reserve a state test of the high voltage battery 310 later to update information on the performance prediction. In this case, the user terminal 200 may transmit a reservation request signal for a state test of the battery to the communication unit 330 of the vehicle 300.

When the reservation time comes, the battery management system 320 may wake up with the power of the auxiliary battery 350. Further, the battery management system 320 performs a state test of the high voltage battery 310 at a reserved time.

In addition, the communication unit 330 may transmit state information of the high voltage battery 310 and information on performance prediction (e.g., driving available distance of a vehicle) to the server 100. In this case, the state information of the battery management system 320 and the data on the performance prediction collected by the server 100 may be used to predict the performance of another vehicle. The server 100 may provide an alarm by transmitting state information on the high voltage battery 310 and information on performance prediction received from the vehicle 300 to the user terminal 200 again.

Meanwhile, it has been described with reference to FIG. 7 that state information and performance of the high voltage battery 310 are predicted, but the present invention is not limited thereto, and performance may be predicted by performing a state test on other types of batteries.

In this way, according to the performance prediction apparatus and application of the battery of the present invention, the battery can be efficiently utilized by predicting the performance of the vehicle battery and the driving available distance based on the environmental condition of the area where the vehicle is parked and the state information of the battery.

In the above, even though all the components constituting the embodiments of the present invention are described as being combined into one or operating in combination, the present invention is not necessarily limited to these embodiments. That is, within the scope of the object of the present invention, all of the constituent elements may be selectively combined and operated in one or more.

In addition, the terms "include", "compose", or "have" as described above means that the corresponding component can be intrinsic, unless otherwise stated, so that it should be interpreted that other components may be further included, not excluded. All terms, including technical or scientific terms, can be interpreted as having the same meaning as generally understood by a person skilled in the art to which the present invention belongs, unless otherwise defined. Generally used terms, such as predefined terms, should be interpreted as being consistent with the contextual meaning of the related art, and are not to be interpreted in an ideal or excessively formal sense, unless explicitly defined in the present invention.

The above description is merely illustrative of the technical idea of the present invention, and those skilled in the art to which the present invention pertains will be able to make various modifications and variations without departing from the essential characteristics of the present invention. Therefore, the embodiments disclosed in the present invention are not intended to limit the technical spirit of the present invention, but to explain, and the scope of the technical spirit of the present invention is not limited by these embodiments. The scope of protection of the present invention should be construed according to the following claims, and all technical ideas falling within the scope of the same shall be construed as falling within the scope of the present invention.

The invention claimed is:

1. A battery performance prediction apparatus for a vehicle, the apparatus comprising:
   a high voltage battery configured to supply a voltage to the vehicle;
   a battery management system (BMS) configured to obtain first state information through a state test of the high voltage battery when the vehicle is driven, and obtain second state information through the state test of the high voltage battery when the battery management system is driven by a wake-up signal in a state in which the vehicle is turned off; and
   a communication unit configured to transmit the first state information and the second state information to the outside,
   wherein the battery management system predicts performance of the high voltage battery comprising an available driving distance of the vehicle based on at least one of the first state information and the second state information.

2. The performance prediction apparatus of claim 1, wherein the battery management system is operated by the wake-up signal generated at a preset reservation time from a user.

3. The performance prediction apparatus of claim 2, wherein the communication unit is configured to receive a reservation request from a user terminal for the vehicle.

4. The performance prediction apparatus of claim 1, wherein the battery management system predicts the performance of the high voltage battery at a preset time interval.

5. A computer-readable media storing instructions of an application that, when executed by a computer, causes the application to perform a method comprising:
   receiving a setting for a parking period and a parking area of a pre-registered vehicle based on a user's input;
   receiving environment information of the parking area during the parking period from an external server;
   receiving first state information on a high voltage battery of the pre-registered vehicle, the first state information being obtained from a battery management system (BMS) of the pre-registered vehicle when the pre-registered vehicle is driven;
   predicting performance of the high voltage battery based on the environment information of the parking area during the parking period and the first state information of the high voltage battery;
   transmitting a request for generating a wake-up signal for operating the battery management system of the pre-registered vehicle in a state in which the pre-registered vehicle is turned off;
   receiving second state information on the high voltage battery, the second state information being obtained from the battery management system of the pre-registered vehicle; and
   updating the performance of the high voltage battery based on the environment information of the parking area and the second state information of the high voltage battery, the updating being performed by a device executing an application that predicts the performance of the high voltage battery,
   wherein the battery management system predicts performance of the high voltage battery comprising an available driving distance of the pre-registered vehicle based on at least one of the first state information and the second state information.

6. The computer-readable media of claim 5, further comprising receiving a reservation request for performing a state test of the high voltage battery of the pre-registered vehicle,
   wherein the transmitting of the request for generating the wake-up signal is performed at a reservation time according to the reservation request.

7. The computer-readable media of claim 5, wherein the request for generating the wake-up signal comprises an instruction for generating the wake-up signal at every preset time interval, and
   wherein the updating of the performance of the high voltage battery is performed at the preset time interval.

8. The computer-readable media of claim 5, wherein the environment information of the parking area comprises temperature and humidity of the parking area.

9. The computer-readable media of claim wherein the first state information comprises state information of the high voltage battery up to a time point when the pre-registered vehicle is turned off after the pre-registered vehicle is parked.

10. The computer-readable media of claim 5, wherein the first state information comprises information on voltage, State of Charge (SOC), and State of Health (SOH) of the high voltage battery.

11. The computer-readable media of claim 5, further comprising simulating a state change trend of the high voltage battery in an environmental condition of the parking area.

12. The computer-readable media of claim 5, further comprising predicting the performance of the high voltage battery based on state information of a battery collected from another pre-registered vehicle parked in the parking area during the parking period.

13. A battery performance prediction apparatus for a vehicle, the apparatus comprising:
   a high voltage battery configured to supply a voltage to the vehicle;
   a battery management system (BMS) configured to obtain first state information through a state test of the high voltage battery when the vehicle is driven, and obtain second state information through the state test of the high voltage battery when the battery management system is driven by a wake-up signal in a state in which the vehicle is turned off; and a communication unit configured to transmit the first state information and the second state information to the outside, wherein the battery management system predicts performance of the high voltage battery based on at least one of the first state information and the second state information, and wherein the battery management system predicts the performance of the high voltage battery at a preset time interval.

* * * * *